United States Patent [19]
Takahashi et al.

[11] Patent Number: 5,438,281
[45] Date of Patent: Aug. 1, 1995

[54] SEMICONDUCTOR INTEGRATED CIRCUIT DEVICE AND DATA PROCESSING SYSTEM HAVING AN INTERFACE WITH REDUCED PARASITIC CAPACITANCE

[75] Inventors: Toshiro Takahashi, Ohme; Kazuo Koide, Iruma, both of Japan

[73] Assignee: Hitachi, Ltd., Tokyo, Japan

[21] Appl. No.: 136,946

[22] Filed: Oct. 18, 1993

[30] Foreign Application Priority Data

Oct. 26, 1992 [JP] Japan .................................. 4-310902

[51] Int. Cl.6 ..................... H03K 19/094; H03K 17/16
[52] U.S. Cl. .......................................... 326/86; 326/30; 326/15
[58] Field of Search .................. 307/475, 443; 326/86, 326/30, 15

[56] References Cited

U.S. PATENT DOCUMENTS

| | | | |
|---|---|---|---|
| 3,723,759 | 3/1973 | Giguere | 307/443 |
| 4,675,551 | 6/1987 | Stevenson et al. | 307/443 |
| 5,019,728 | 5/1991 | Sanwo et al. | 307/443 |
| 5,023,488 | 6/1991 | Gunning . | |
| 5,132,564 | 7/1992 | Fletcher et al. | 307/443 |
| 5,136,187 | 8/1992 | Ceccherelli et al. | 307/443 |
| 5,138,203 | 8/1992 | Ono et al. | 307/443 |
| 5,276,364 | 1/1994 | Wellheuser | 307/443 |

*Primary Examiner*—Edward P. Westin
*Assistant Examiner*—Richard Roseen
*Attorney, Agent, or Firm*—Fay, Sharpe, Beall, Fagan, Minnich & McKee

[57] ABSTRACT

Data to be processed are transferred by connecting a one-way element having a reduced parasitic capacitance such as the Schottky diode between an output MOSFET having an open drain structure and an output terminal to be connected with a bus line terminated by an impedance element.

37 Claims, 10 Drawing Sheets

SEMICONDUCTOR INTEGRATED CIRCUIT DEVICE AND DATA PROCESSING SYSTEM HAVING AN INTERFACE WITH REDUCED PARASITIC CAPACITANCE

BACKGROUND OF THE INVENTION

The present invention relates to a semiconductor integrated circuit device and a data processing system. More particularly, the present invention is more effective if applied to a device including an output buffer connected with a bus line terminated by a resistor, or the like, for outputting data with a small voltage swing and at a high speed.

A semiconductor integrated circuit device composed of MOSFETs (Metal Oxide Semiconductor Field Effect Transistors), having features of high integration and low power dissipation, is speeded up as the process technique progresses. The interface between the ordinary MOS integrated circuit of the prior art is made either at the TTL (i.e., Transistor-Transistor Logic) level having a signal swing of 0 V to 5 V or at the CMOS (i.e., Complementary MOS) level having a signal swing of 0 V to 3 V, and where the bus line is not terminated. As a result, this interfacing method is subjected to irregular reflections in signal waveforms caused by the characteristic impedance of a printed circuit board. Thus, the delay time in the signal transfers between the semiconductor integrated circuits is equivalently elongated to limit the data transfer rate to about 100 MHz.

Figure 9:
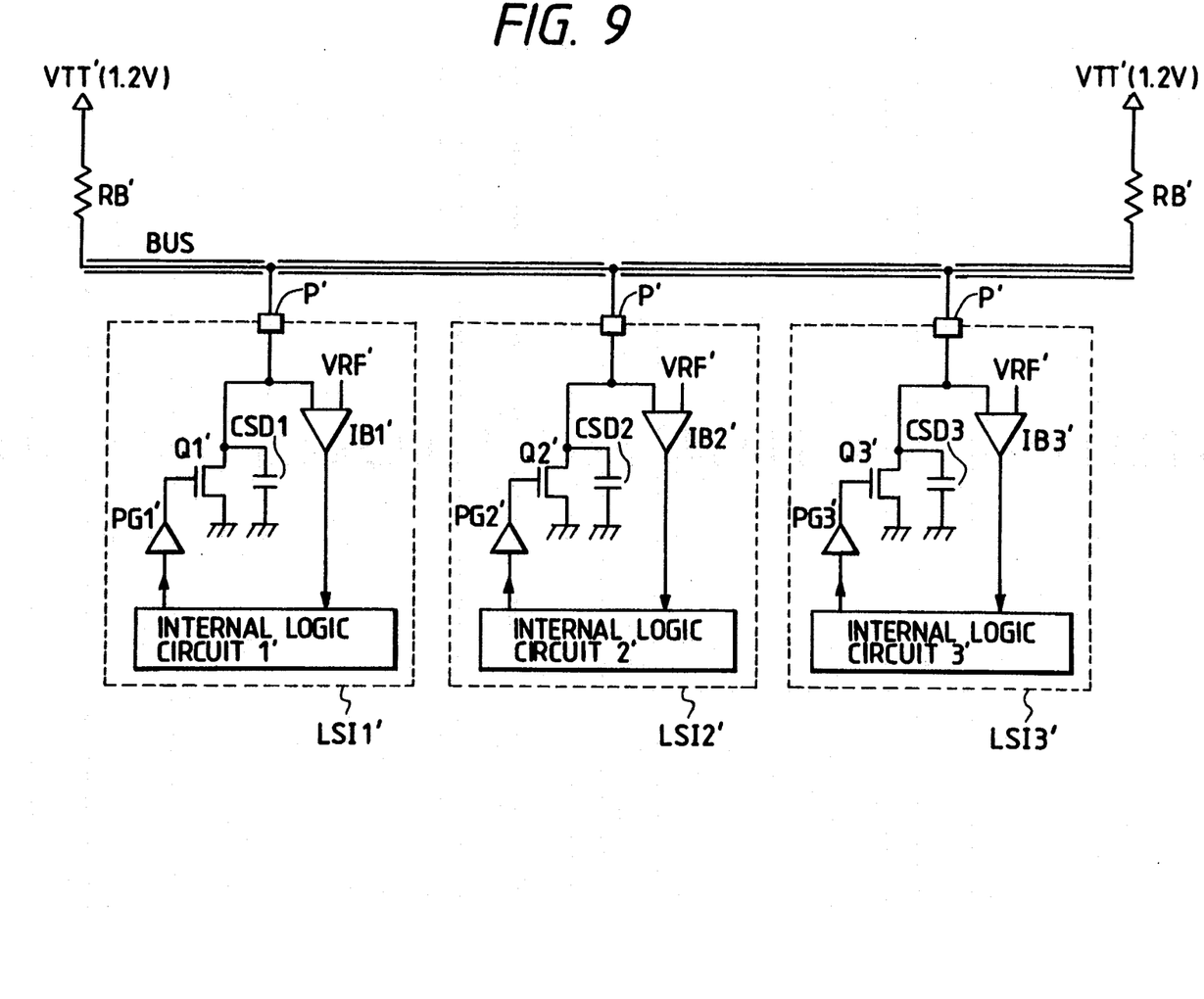
FIG. 9 is a block diagram showing one example of the prior art.

Thus, there is proposed in U.S. Pat. No. 5,023,488, for example, an interfacing method by which the characteristic impedance of the printed circuit board is matched with a terminal resistor RB', as shown in FIG. 9, so that the data may be sent with a small voltage swing and at a high speed while suppressing reflections of the transfer signals.

SUMMARY OF THE INVENTION

Figure 8:
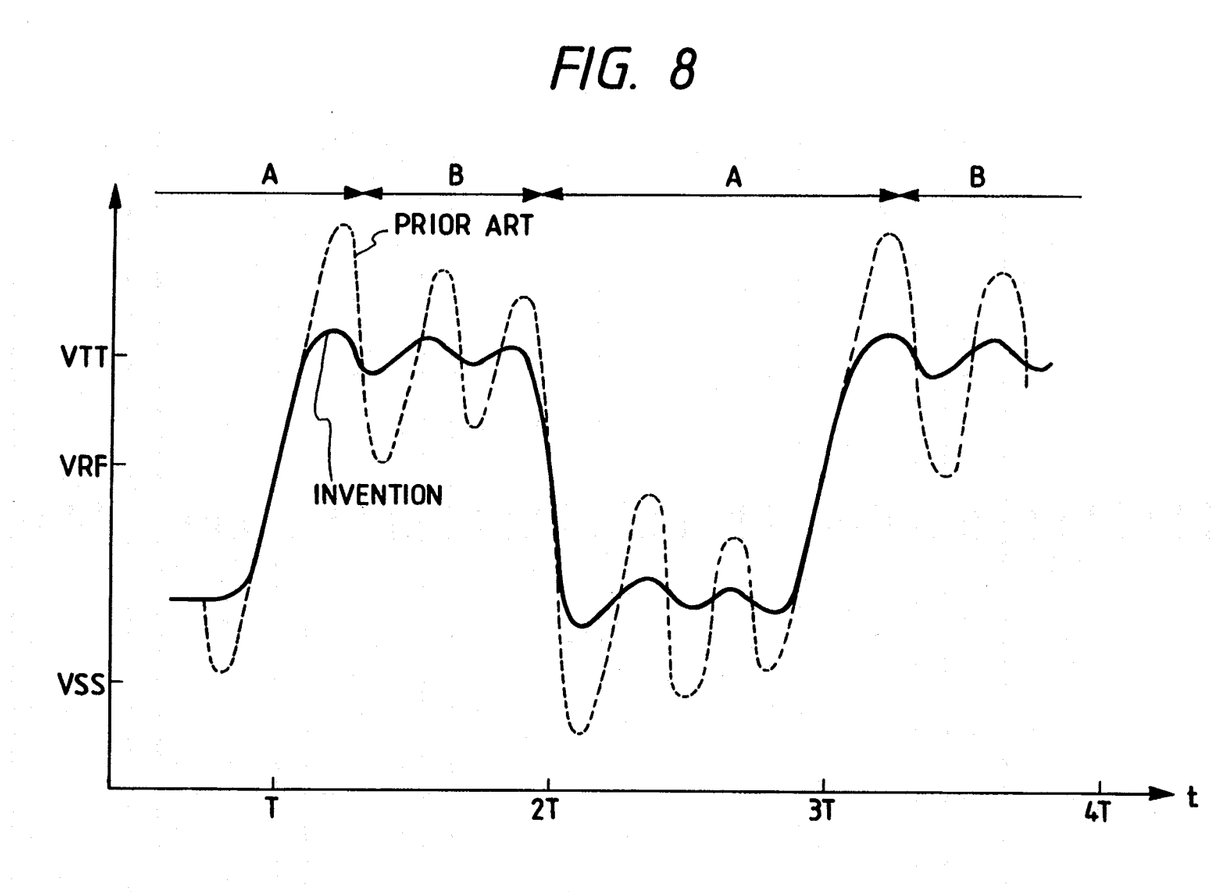
FIG. 8 is a signal waveform chart for explaining the present invention.

The interfacing method described above has failed to take into consideration the parasitic capacitance of the semiconductor integrated circuit. Thus, we have found that the characteristic impedance of the bus line on the printed circuit board is disturbed in the vicinity of the external terminal of the semiconductor integrated circuit so that irregular reflections are caused in the signal waveforms, as shown in FIG. 8, thereby inerting a signal delay that is equivalent to the time period in order for the signal level to be stabilized.

Of the parasitic capacitances, a drain diffusion capacitance CSD of the output MOSFETs having an open drain structure is high. This is because the area of the drain diffusion layer has to be enlarged for raising an electrostatic breakdown voltage. In other words, if the area of the drain diffusion layer is reduced to decrease the parasitic capacitance, the electrostatic breakdown voltage is accordingly dropped.

An object of the present invention is to provide a semiconductor integrated circuit device and a data processing system realizing a high-speed data transfer while retaining a lower electrostatic breakdown voltage.

The aforementioned and other objects and novel features of the present invention will become apparent from the following description made with reference to the accompanying drawings.

A summary of the invention to be disclosed herein will be briefly described in the following. Specifically, a data transfer for data processing is carried out by interposing a one-way element having a reduced parasitic capacitance such as a Schottky barrier diode (hereinafter referred to as the "Schottky diode") between an output MOSFET having an open drain structure and an output terminal. The output terminal is connected to a bus line which is terminated by an impedance element.

Even with an output MOSFET with a large drain diffusion layer the drain parasitic capacitance, as viewed from an external terminal, can be made to disappear in the OFF state of the Schottky diode so that the characteristic impedance of the bus line in the vicinity of the external terminal can be avoided, thereby reducing the equivalent signal delay drastically.

DESCRIPTION OF THE PREFERRED EMBODIMENTS

Figure 1:
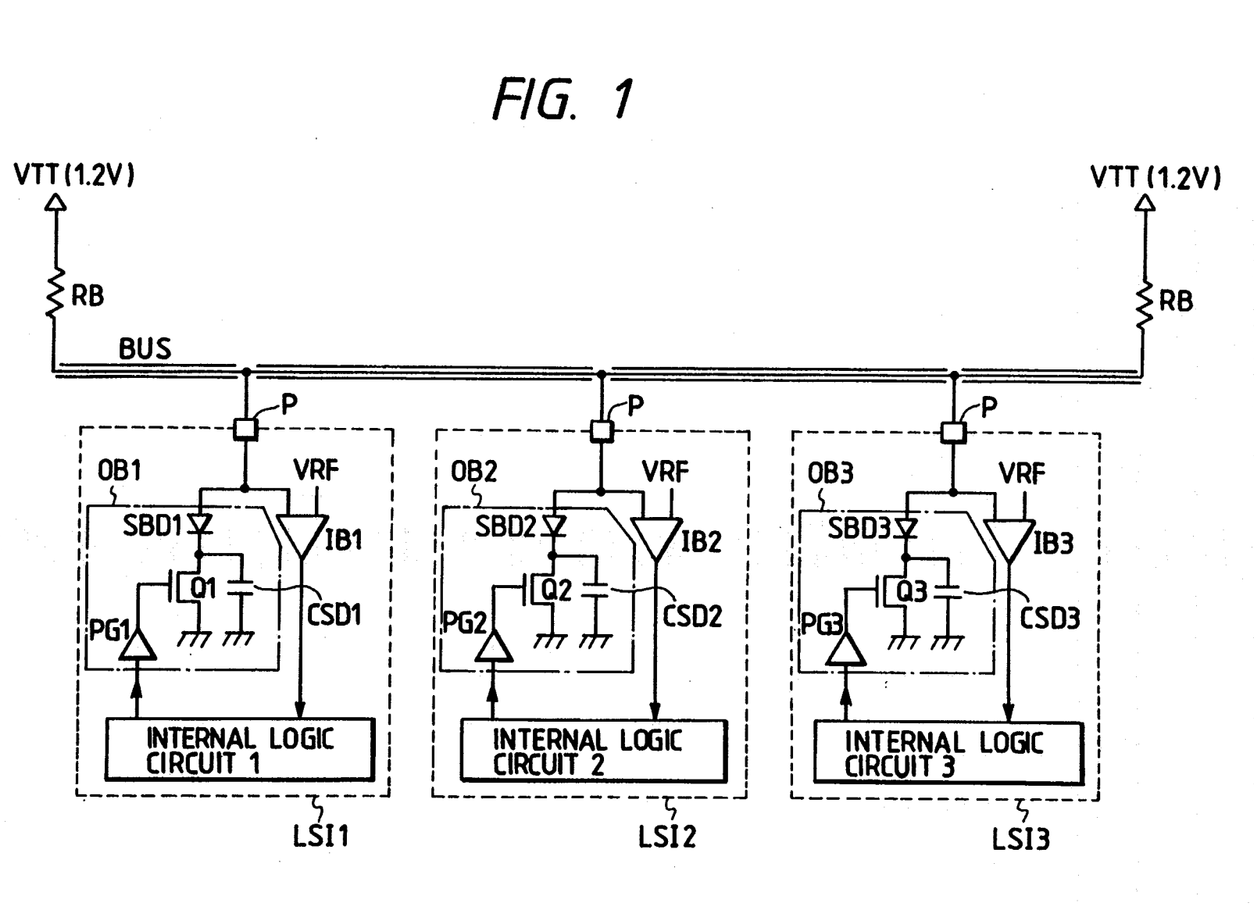
FIG. 1 is a block diagram showing a bus structure in a semiconductor integrated circuit device according to the present invention and a data processing system using the device.

FIG. 1 is a block diagram showing a bus structure in a semiconductor integrated circuit device according to the present invention and a data processing system using the device. In FIG. 1, semiconductor integrated circuit devices LSI1 to LSI3, as enclosed by dotted lines, are formed over a single semiconductor substrate of single crystalline silicon by the well-known technique of fabricating a semiconductor integrated circuit.

Each of the semiconductor integrated circuit devices LSI1 t LSI3 is constructed to include one input/output buffer and an internal logic circuit, as representatively shown. The semiconductor integrated circuit device LSI1 will now be described by way of example. An output buffer OB1 includes a driver PC1, a MOSFET Q1 having an open drain structure, and a diode SBD1 connected between the drain of the output MOSFET Q1 and an external terminal P. The aforementioned diode may be exemplified by a Schottky diode, although not especially limited thereto. The Schottky diode is advantageous, as will be described, in that its parasitic capacitance is small for a high-speed operation and in that it can be integrally formed with a drain contact hole, thereby providing high integration.

An input buffer IB1 is given a differential configuration for comparing an input signal with a reference voltage VRF. An internal logic circuit 1 receives input data from the input buffer IB1 and processes the data to send a signal, if necessary, to other semiconductor integrated circuit devices LSI2 and LSI3 through the output buffer OB1. These other semiconductor integrated circuit devices LSI2 and LSI3 are given structures similar to the aforementioned one. This means, however, that all the circuits are identical. The individual semiconductor integrated circuit devices LSI1 to LSI3 may have different numbers of input buffers and output buffers in accordance with their functions and shared roles. Moreover, the internal logic circuits 1 to 3 are constructed according to their individual functions.

The bus for effecting the data transfers among the aforementioned semiconductor integrated circuit devices LSI1 to LSI3 is made of wiring lines formed over a packaging substrate such as the printed circuit board, although not especially limited thereto. The bus is terminated by a terminal resistor RB (of about 50 $\Omega$) which is matched by the characteristic impedance of the bus, and is supplied with a terminal voltage VTT such as 1.2 V.

In the semiconductor integrated circuit device LSI1, the output MOSFET Q1 is given a large diffusion layer for a high electrostatic breakdown voltage. As a result, a high parasitic capacitance CSD1 is established at the drain of the MOSFET Q1. If an output MOSFET Q1' has its drain connected directly with an external terminal P', as shown in FIG. 9, the characteristic impedance of the bus line connected with the external terminal P' is disturbed to establish irregular reflections in the signal waveforms, thereby elongating the delay time.

For example, a mismatch of 20% or more is caused in the case that semiconductor integrated circuit devices having a pin capacitance of 8 pF are connected at an interval of 8 cm with the bus line having the terminal resistance RB of 50 $\Omega$. As a result, even if the bus line is terminated by the terminal resistor RB, serious irregular reflections are caused, as shown in FIG. 8, in the vicinity of the connection with the external pins of the semiconductor integrated circuit device.

In the embodiment of FIG. 1, the parasitic capacitance of the Schottky diode SBD1 and the parasitic capacitance CSD1 in the drain of the output MOSFET Q1 are connected in series by interposing the Schottky diode SBD1 between the drain of the output MOSFET Q1 and the external terminal P. As a result, the parasitic capacitance, as viewed at the external terminal P, can be reduced substantially to 0 due to the presence of the parasitic capacitance of the Schottky diode SBD1 when this diode SBDZ is off.

While the output MOSFETs Q1 to Q3 of the semiconductor integrated circuit devices LSI1 to LSI3 are in FIG. 1, the potential of the bus is at the level of the terminal voltage VTT of 1.2 V. When any one or more output MOSFETs of the semiconductor integrated circuit devices LSI1 to LSI5 are turned ON, the bus potential is changed to a level approximately equal to a ground potential of 0.4 V. Therefore, when data are to be transferred from the semiconductor integrated circuit device LSI1 to the semiconductor integrated circuit device LSI5, the data at the high or low level are sent out by turning OFF the output MOSFETs Q2 and QS of the semiconductor integrated circuit devices LSI2 and LSI3 and by turning ON/OFF the output MOSFET Q1 of the semiconductor integrated circuit device LSI1 in accordance with the internal signal to be outputted.

In the semiconductor integrated circuit devices LSI2 and LSI3 in which the output MOSFETs Q2 and Q3 of output buffers OB2 and OB3 are OFF, the parasitic capacitances CSD2 and CSD3 of the drains of the MOSFETs Q2 and Q3 are charged to a level approximately equal to the voltage VTT by the bouncing at the time when the bus takes the high level. As a result, Schottky diodes SBD2 and SBD3 are OFF no matter whether the subsequent level of the bus might be high or low. Thus, these parasitic capacitances CSD2 and CSD3 disappear from the bus line.

In the semiconductor integrated circuit device LSI1 which is repeatedly turned ON/OFF, moreover, the Schottky diode SBD1 is ON at a timing A, in which the output MOSFET Q1 is ON as shown in FIG. 8, so that the parasitic capacitance CSD1 is connected with the bus line. At a timing B in which the output MOSFET Q1 is OFF, the parasitic CSD1 is charged to the voltage VTT at the first rise from the instant when the output MOSFET Q1 is turned OFF. As a result, the Schottky diode SBD1 is turned OFF to make the parasitic capacitance CSD1 disappear from the bus line.

More specifically, in the circuit of the prior art shown in FIG. 9, the parasitic capacitances CSD1 to CSD3 having high capacitance values at all times with respect to the bus line are connected. In the present invention, as shown in FIG. 1, of the parasitic capacitances CSD, either one corresponding to one output buffer in the operating state or all disappear from the bus line. As a result, the waveform of the signal to be transmitted through the bus line can have its vibrations due to the irregular reflections reduced drastically, as indicated by the solid curve in FIG. 8, so that the equivalent signal delay can be reduced to speed up the signal transfer.

On the other hand, the electrostatic breakdown voltage, of the case in which the semiconductor integrated circuit device LSI1 is handled by itself, is expressed by VSD1=Q/CSD1, because a charge on the external terminal P is transmitted to the parasitic capacitance CSD1 of the drain through the Schottky diode SBD1. As a result, the electrostatic breakdown voltage can be set to a high level.

Figure 2:
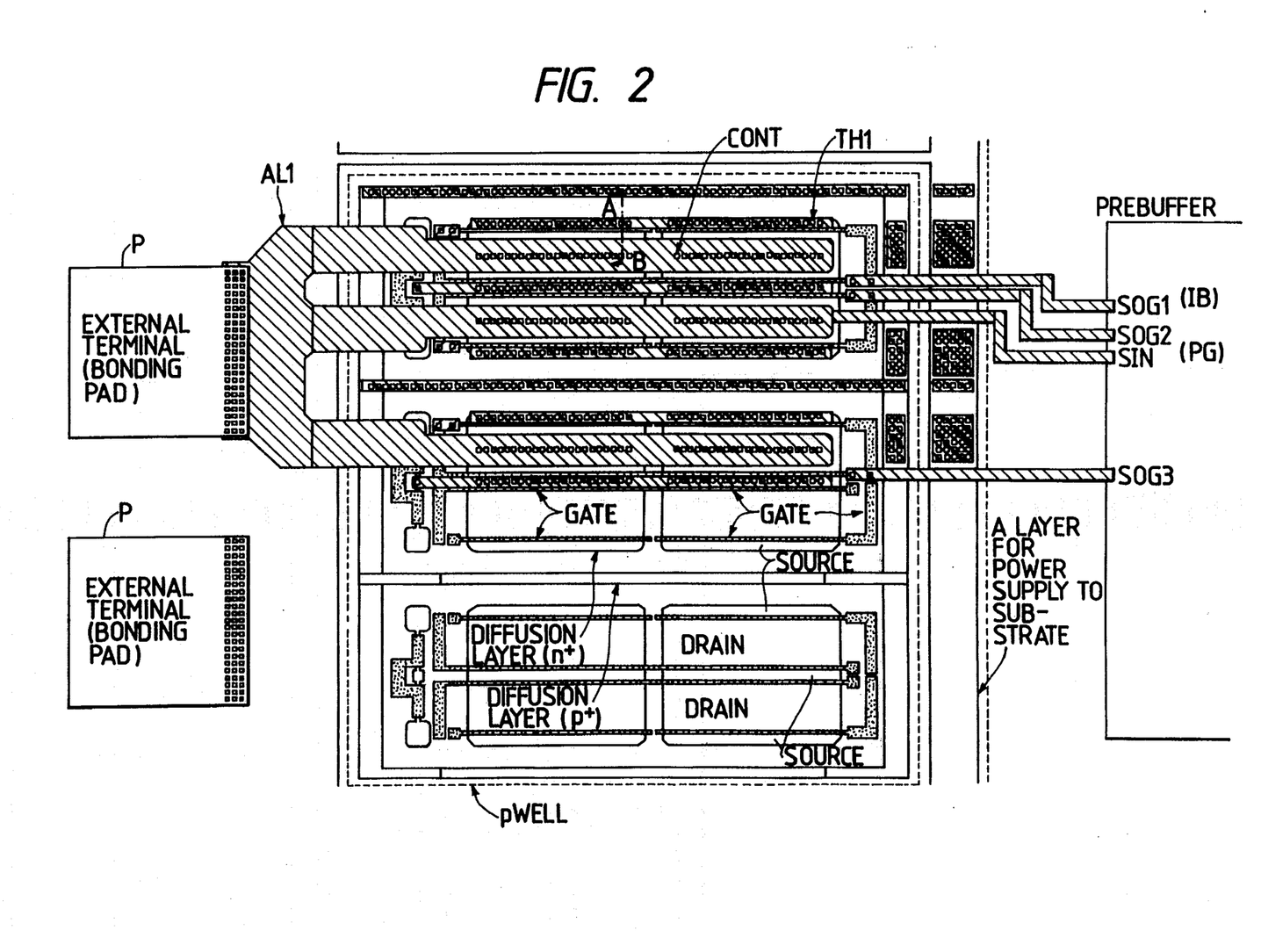
FIG. 2 is a layout diagram showing one embodiment of an output buffer according to the present invention.

FIG. 2 is a layout diagram showing one embodiment of the aforementioned output buffer. Generally speaking, the output MOSFET having its drain connected directly with the external terminal (or bonding pad) is formed independently of its driver or a prebuffer including the input buffer for the operations of latching up, thereby retaining the electrostatic breakdown voltage and driving with a large current, and has a specially devised layout.

In order to retain the electrostatic breakdown voltage, the MOSFET is protected against the surge voltage with the parasitic resistance and parasitic capacitance of the diffusion layer of the drain by increasing the area of the diffusion layer and the contact distance between the gate and the drain, and the surge current is released to the substrate. In the input buffer, the electrostatic breakdown voltage can be retained because the gate of the input buffer is also covered with the drain diffusion layer of the output MOSFET. However, the result is that the drain diffusion layer is excessively enlarged to cause trouble with the high-speed operation.

In FIG. 2, there are shown a plurality of MOSFETs corresponding to the two external terminals P (or bonding pads). Of these, the output MOSFETs formed at the lower side are shown to omit their aluminum layer to be connected with the external terminals P (or bonding pads), so that their patterns may be easily understood. Reference letters AL1 designate a first aluminum layer; letters CONT designate contact holes; and letters TH1 designate through holes. The MOSFET has its gate electrode formed of a first polycrystalline silicon layer.

In the contact holes CONT for connecting the aluminum layer AL1 and the drains of the output MOSFETs, there is formed a Schottky diode SBD, which will be described in the following. Thus, the Schottky diode SBD can be formed without any special element forming region over the semiconductor substrate. The advantage of using the Schottky diode SBD resides in the fact that the parasitic capacitance is small when the Schottky diode SBD is OFF, in addition to the aforementioned advantage of the layout. Because of the small parasitic capacitance of the Schottky diode SBD, the drain parasitic capacitance CSD can be substantially made to disappear from the side of the bonding pads (or the bus line) because the parasitic capacitance of the Schottky diode SBD and the drain parasitic capacitance of the output MOSFETs are connected in series.

The following description is directed to the output MOSFETs formed at the upper side of FIG. 2. The aluminum layer AL1 composing the external terminals P (or bonding pads) is extended as shown and is connected by the contacts CONT with the diffusion layer forming the drains or the starting points of the output MOSFETs. Across the gate electrodes formed over and below that aluminum layer AL1, there is formed the diffusion layer for forming the source. This diffusion layer is connected through the through holes TH1 with the wiring line for supplying the power to the substrate.

In this embodiment, one output MOSFET is equipped, as shown by the lower output MOSFET, with a total of nine gates, i.e., three longer gates and six gates having a half length. By connecting these electrodes selectively according to the current driving ability of the output MOSFET, it is possible to form an output MOSFET having a variety of current driving abilities. In this case, by changing the pattern of the aluminum layer AL1 to be connected with the external terminals (or bonding pads), the drain diffusion layer corresponding to the unused gate may be used as a dummy diffusion layer to raise the electrostatic breakdown voltage or to make the latch-up hard to occur.

In FIG. 2, a prebuffer is provided at the right hand side. This prebuffer includes an input buffer IB and a driver PG. Signal lines SOG1 to SOG3 are wiring lines for transmitting the output signals prepared by the driver PG to the gates of the output MOSFETs. The signal lines SOG1 to SOG3 are shorted and connected with the output of the driver PG. A signal line SIN is connected with the aluminum layer AL1 and further with the input terminal of the input buffer IB.

FIGS. 3A to 3E are partial sections showing fabrication steps for explaining one embodiment of an elemental structure and corresponding to a portion A–B of FIG. 2.

Figure 3A:
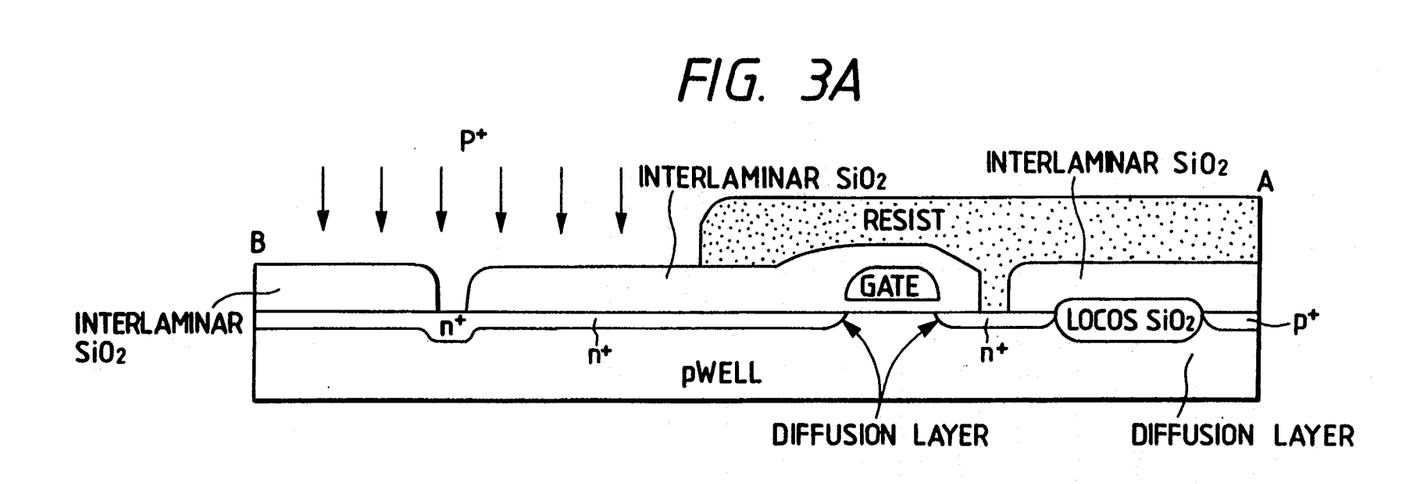
FIGS. 3A, 3B, 3C, 3D and 3E are partial sections showing fabrication steps for explaining one embodiment of an element structure and corresponding to a portion A-B of FIG. 2.

In FIG. 3A, by employing the ordinary fabrication step of a MOSFET, there are formed over a p-Well region an n+-diffusion layer having a larger area for forming the drains of output MOSFETs and an n+-diffusion layer having a smaller area for forming the sources of the same. An interlaminar insulating film (of SiO2) is formed over the aforementioned drain and source n+-diffusion layers with contact holes, where the contact holes for the sources are selectively formed with a resist film. This resist film and the interlaminar insulating film are used as a mask to inject the ions of phosphor (P+) to deepen the drain (n+) region corresponding to the contact portion.

Figure 3B:
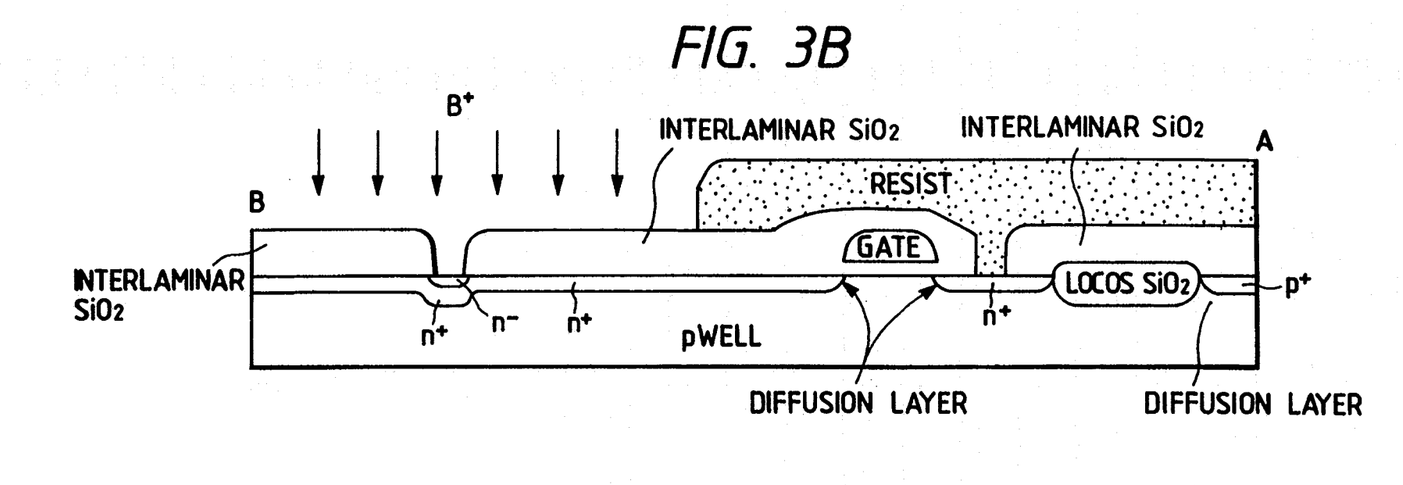

In FIG. 3B, the same resist film and interlaminar insulating film are used as a mask to inject the ions of boron (B+) to return the impurity concentration of the drain region surface of the contact portion to the n−-type.

Figure 3C:
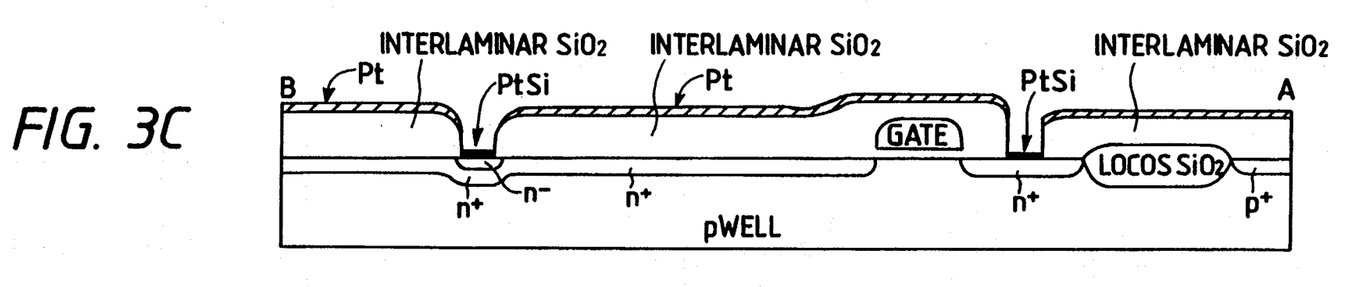

In FIG. 3C, the resist film is removed to deposit thin platinum (Pt) by sputtering. After this, a heat treatment is carried out to form a platinum silicide PtSi by reaction with the silicon of the semiconductor substrate.

Figure 3D:
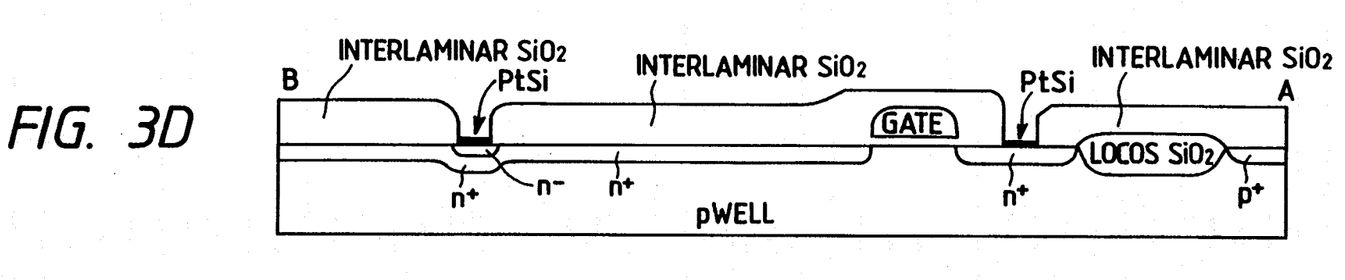

In FIG. 3D, the platinum Pt is etched to leave the platinum silicide PtSi only at the contact portion. As a result, the Schottky diode is formed in the contact portion which is returned to the n−-type by the ion implantation.

Figure 3E:
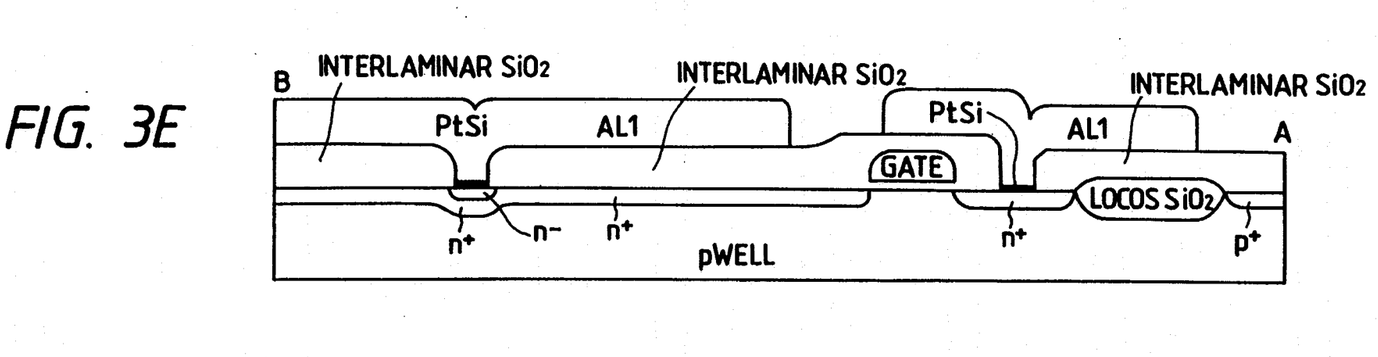

In FIG. 3E, by the sputtering vapor deposition of the aluminum layer AL1 as the metal wiring layer and patterning, the drain region is integrally formed with the Schottky diode between the external terminal P and the drain of the output MOSFET by making use of the drain contact holes of the MOSFET. incidentally, the source region is formed with a stable ohmic contact because the source region has the n+-surface layer, so that any undesired reaction between the aluminum and the silicon can be prevented.

In the case where the Schottky diode is formed with a small area in self-alignment with the contact hole formed in the drain region of the output MOSFET, it is possible to reduce a parasitic capacitance CSBD. It is also possible to retain a sufficiently high electrostatic breakdown voltage because of the drain diffusion layer formed just below to have a large area as in the prior art.

Figure 4:
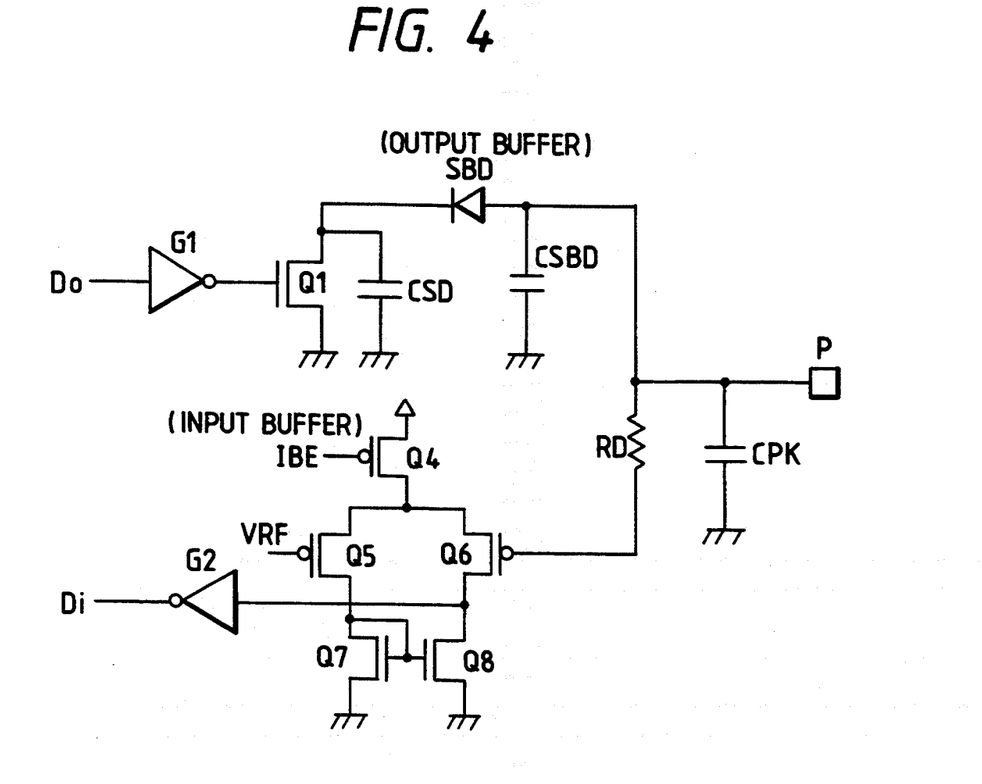
FIG. 4 is a circuit diagram showing one embodiment of an input/output buffer according to the present invention.

FIG. 4 is a circuit diagram showing one embodiment of an input/output buffer according to the present invention. An output signal do produced by the internal logic circuit is fed to the gate of the output MOSFET Q1 through a driver G1. This driver G1 is illustrated by an inverter but may be exemplified by a logic gate circuit given a logic function.

At the drain of the aforementioned output MOSFET Q1, there exists the drain parasitic capacitance CSD which is given a high resistance corresponding to the large drain area. The drain of the NIOSFET Q1 is connected through the Schottky diode SBD with the external terminal P. The capacitance between the anode of the Schottky diode SBD and the ground potential point of the circuit is that of the Schottky diode SBD.

A capacitance CPK connected with the external terminal (or bonding pad) P is a parasitic capacitance belonging to the external pin such as the bonding pad. The external terminal P is connected with the input terminal of the input buffer.

The input buffer includes: P-channel type MOSFETs Q5 and Q6 in the differential mode; a P-channel type MOSFET Q4 connected between the common source of the MOSFETs Q5 and Q6 and the power source voltage for feeding a bias current; and N-channel type load MOSFETs Q7 and Q8 in the current mirror mode connected between the common drain of the differential MOSFETs Q5 and Q6 and the ground potential point of the circuit. MOSFET Q5 has its gate supplied with the reference voltage VRF. MOSFET Q6 has its gate connected with the external terminal P through a resistor RD. The MOSFET Q4 has its gate supplied with a control signal IBE for activating the input buffer, although not especially limited thereto.

When the control signal IBE takes a low level such as the ground potential, the P-channel type MOSFET Q4 is turned ON to feed a bias current necessary for operating the differential amplification MOSFETs Q5 and Q6. When the input signal from the external terminal P is at a higher level than the reference voltage VRF, the MOSFET Q6 is turned OFF whereas the MOSFET Q5 is turned ON. As a result, the bias current produced by the MOSFET Q4 is fed through the MOSFET Q5 to the MOSFET Q7 so that the drain voltage of the MOSFET Q8 at the output side is substantially dropped to a low level such as the ground potential of the circuit and fetched by the internal logic circuit through an inverter G2.

When the input signal inputted through the external terminal P is at a lower level than the reference voltage VRF, the MOSFET Q6 is turned ON whereas the MOSFET Q5 is turned OFF. As a result, the bias current produced by the MOSFET Q4 is fled through the MOSFET Q6. Since, at this time, the MOSFET Q7 is also turned OFF in response to the OFF status of the MOSFET Q5, the MOSFET Q8 at the output side is also turned OFF. Thus, in response to the ON status of the MOSFET Q6, a high level such as the power source voltage is produced and fetched by the internal logic circuit through the inverter G2. In the case where the aforementioned P-channel type differential circuit is used, a small swing can be fetched with such a small level as has a high level of 1.2 V produced by the output buffer of another semiconductor integrated circuit device and a low level of 0.4 V.

By the aforementioned actions of the output buffer, the drain parasitic capacitance CSD of the output MOSFET Q1 causes one or all of the semiconductor integrated circuit devices to disappear from the side of the external terminal P. Moreover, the value of the parasitic capacitance CSBD of the aforementioned Schottky diode SBD can be neglected because it is structurally small. As a result, the capacitance CPK connected with the output terminal P of the semiconductor integrated circuit device can reduce the total pin capacitance CPK if it too is reduced. Thus, the influences upon the characteristic impedance of the bus line can be reduced to permit transfer the data at a high speed, as described above.

Figure 5:
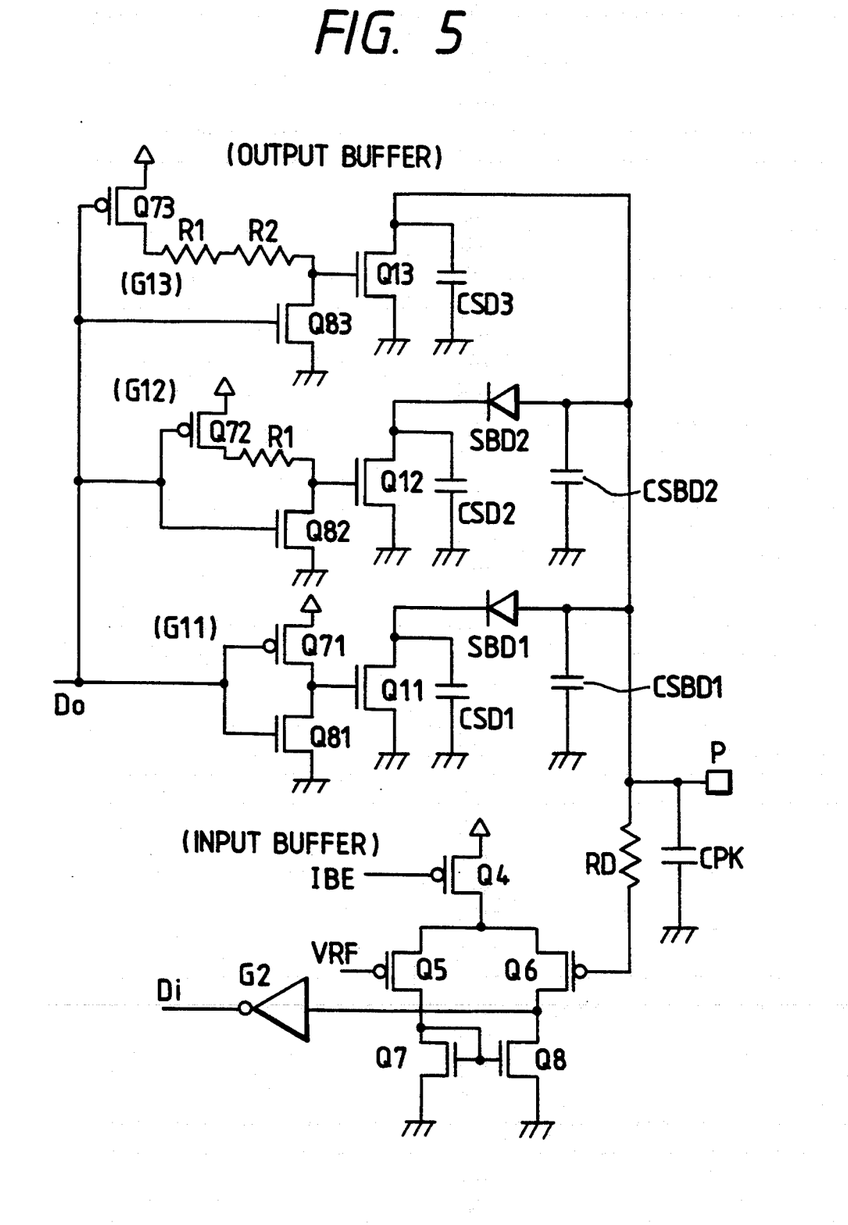
FIG. 5 is a circuit diagram showing another embodiment of the input/output buffer according to the present invention.

FIG. 5 is a circuit diagram showing another embodiment of the input/output buffer according to the present invention. This embodiment is aimed at reducing the noises which are generated in the output buffer. Specifically, when a large current is fed with the output MOSFETs being ON, relatively serious noises are generated in the ground potential by the parasitic resistance and inductance component in the ground potential line of the circuit.

In this embodiment, three output MOSFETs are provided, i.e., Q11, Q12 and Q13. Of these, the output MOSFETs Q11 and Q12 are given a relatively large size for reducing the level of the bus line to the low level at a high speed. On the other hand, the output MOSFET Q13 is provided for level compensations, as will be described later, and is given a smaller size. As a result, the drain parasitic capacitances CSD1 and CSD2 corresponding to the output MOSFETs Q11 and Q12 are relatively large, but the drain parasitic capacitance CSD3 corresponding to the output MOSFET Q13 is small.

The CMOS inverters acting as the drivers G11 to G13 receive the output signal Do commonly. With respect to driver G12, in order to produce its output signal at a late timing, a resistor R1 is connected between a P-channel type MOSFET Q72 and an N-channel type MOSFET Q82. With respect to driver G13, in order to produce its output signal at the latest timing, resistors R1 and R2 are connected in series with a larger resistance between a P-channel MOSFET Q73 and an N-channel MOSFET Q83.

The aforementioned resistors R1 and R2 adjust the timings for turning the output MOSFETs Q12 and from OFF to ON. Therefore, the resistors R1 and R2 are connected between the output nodes of the drivers G11 to G13 and the P-channel MOSFETs Q72 and Q73 used for producing output signals at the high level. On the other hand, the N-channel type MOSFETs Q81 to Q83 of the drivers G11 to G13 used for turning the output MOSFETs Q11 to Q13 from ON to OFF have their drains connected with the output nodes.

When the signal Do changes from the high to low level, the N-channel MOSFETs Q81 to Q83 are turned OFF all at once, whereas the P-channel MOSFETs Q71 to Q73 are turned ON all at once. In response to the ON status of the P-channel MOSFET Q71, the gate voltage of the output MOSFET Q11 is instantly raised to the high level. As a result, the output MOSFET Q11 is turned ON to drop the external terminal P from the high to low level. Since the MOSFET Q11 is made smaller than the MOSFET Q12, its through current can be reduced to suppress the noises which are generated in the ground line of the circuit.

In response to the low level of the aforementioned signal Do, the P-channel type MOSFET Q72 is turned ON, but the gate voltage of the output MOSFET Q12 has its rise delayed by the time constant which is determined by the ON resistance of the MOSFET Q72, the resistor R1 and the gate capacitance of the output MOSFET Q12. As a result, the ON timing of the output MOSFET Q12 is accordingly delayed by the output MOSFET Q11. When the MOSFET Q12 is turned ON, the external terminal P is extracted by the resultant current of the MOSFETs Q11 and Q12 so that the output signal is quickly changed from the high to low level.

In response to the low level of the signal Do, the P-channel type MOSFET Q73 is also turned ON, but the gate voltage of the output MOSFET Q13 has its rise further delayed by the time constant which is determined by the ON resistance of the MOSFET Q73, the resistors R1 and R2 and the gate capacitance of the output MOSFET Q13. As a result, the timing for turning ON the output MOSFET Q13 is further delayed. At the timing for turning ON the MOSFET Q13, the voltage that is established is the addition of the source-drain voltages of the output MOSFETs and the forward voltages of the Schottky diodes SBD1 and SBD2. In other words, the output signal at the low level is shifted to the high level to deteriorate the level margin by the Schottky diodes SBD1 and SBD2 which are provided for reducing the parasitic capacitance, as described above. When the MOSFET Q13 is turned ON, on the other hand, the forward voltage components in the Schottky diodes SBD1 and SBD2 are discharged to retain the margin at the low level.

Thus, by dividing the output MOSFETs and operating them in time series, the noises to be generated on the power source line such as the ground potential of the circuit can be suppressed, and the output MOSFET to be turned ON in the last order is enabled to retain the low level margin by reducing its drain size to omit the Schottky diode. Incidentally, the input buffer of FIG. 5 will not be described because it is constructed of a circuit similar to that of FIG. 4.

Figure 6:
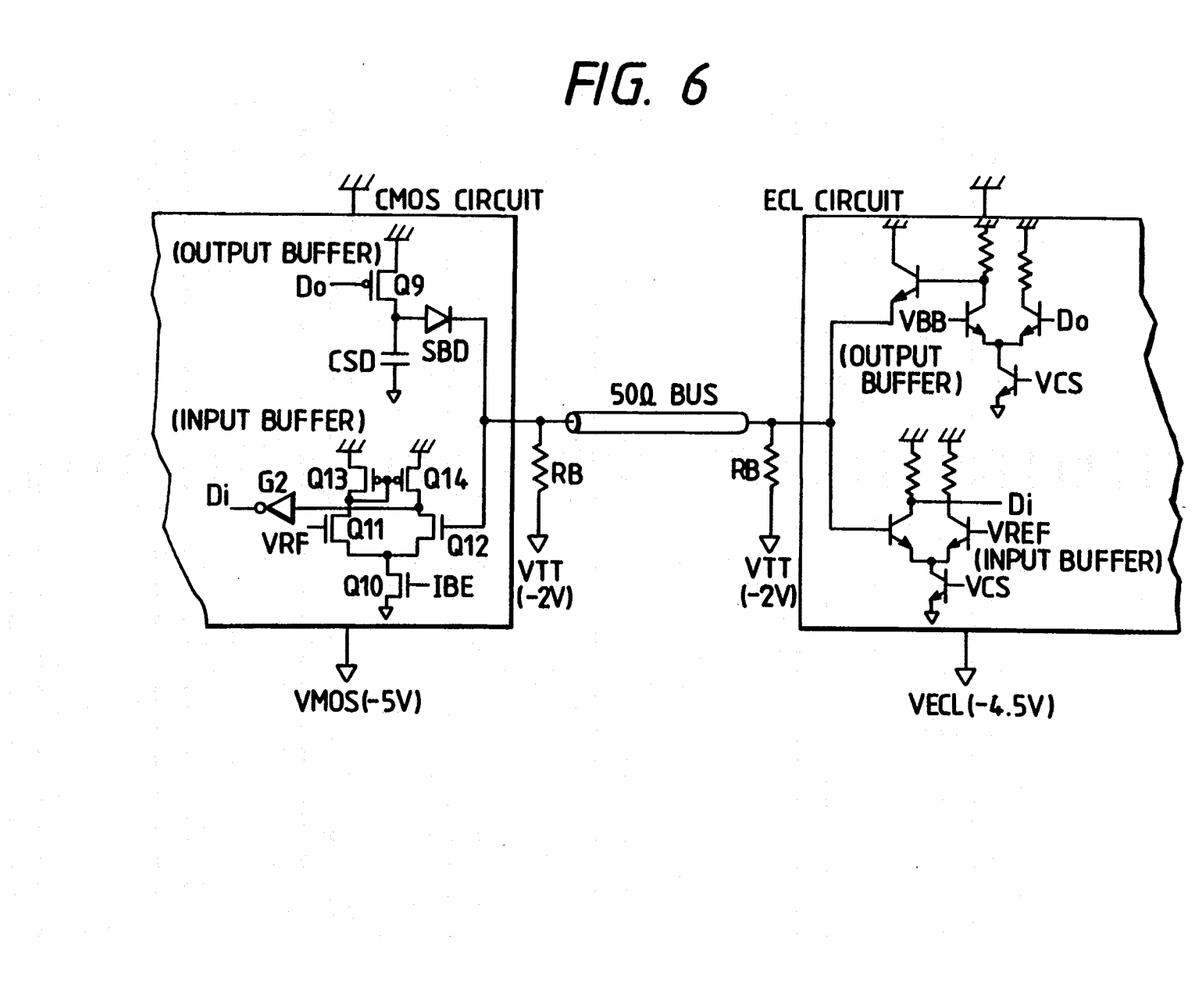
FIG. 6 is a circuit diagram showing one embodiment of a case in which a CMOS circuit and an ECL circuit are connected through a bus.

FIG. 6 is a circuit diagram showing one embodiment of a case in which a CMOS circuit and an ECL circuit are connected through a bus. In the CMOS circuit, a power source voltage VMOS has the same negative polarity of −5 V as that of the ECL circuit. The output buffer at the CMOS circuit is given an open drain structure by a P-Channel type MOSFET Q9. In this case, too, the Schottky diode SBD is inserted so that the large parasitic capacitance CSD at the drain may disappear from the bus side. When the output MOSFET Q9 is ON, the ECL high level of about −0.7 V can be produced by the source-drain voltage of the MOSFET Q9 and the forward voltage of the Schottky diode SBD. When the output MOSFET Q9 is OFF, the level is set to −2 V by the voltage VTT.

In the ECL circuit, the input buffer at the side of the CMOS circuit is constructed of a differential circuit composed of the N-channel MOSFETs Q11 and Q12 in a manner to correspond to the small swing level shifted to the ground potential side. The differential circuit thus composed is inverted in polarity from the MOSFETs composing the aforementioned input buffer of FIGS. 4 and 5 and accordingly uses the MOSFETs of the opposite polarity having a negative operating voltage. The output signal of this differential circuit is changed into an input signal Di of the CMOS level by the inverter G2 and is fetched by the internal logic circuit.

The bus line has its two terminals supplied with the voltage VTT of −2 V through the terminal resistors RB. The output buffer at the ECL circuit includes a differential transistor circuit forming the ECL circuit, and an emitter-follower output transistor. The input buffer at the ECL circuit includes a differential transistor circuit, The differential transistor circuit of the input buffer fetches the high level of −0.7 V and the low level of −2 V by discriminating them with a reference voltage VREF or a middle potential of the two levels. As a result, the saturation of the ECL differential transistor can be prevented so that the input signal may be fetched at a high speed.

Figure 7:
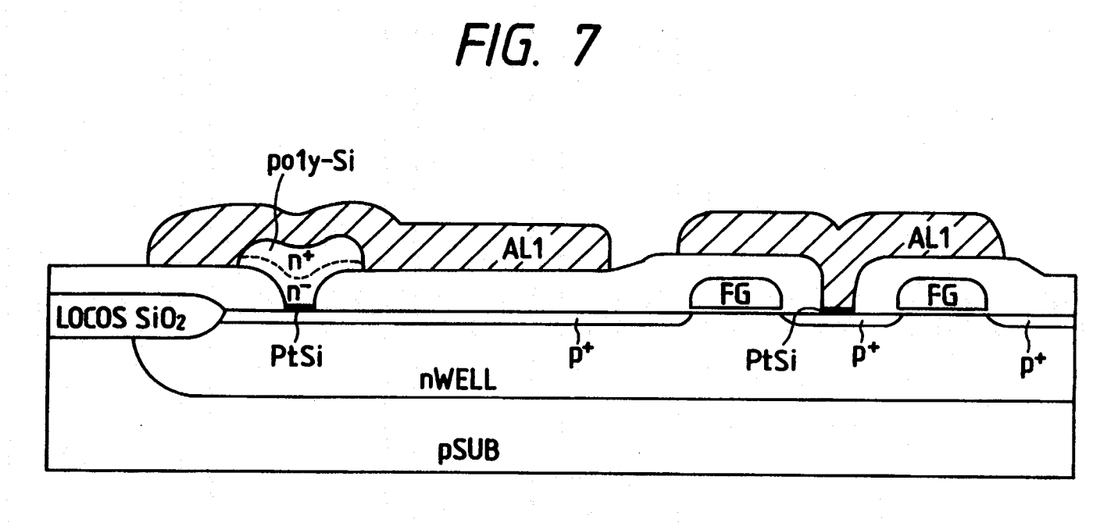
FIG. 7 is a section showing an elemental structure of one embodiment of an output MOSFET Q1 and a Schottky diode SBD of FIG. 6.

FIG. 7 is a section showing an element structure of one embodiment of the output MOSFET Q9 and the Schottky diode SBD. The Schottky diode of this embodiment is constructed by forming the platinum silicide PtSi, as mentioned before, over the p+-layer forming the drain region to provide an excellent ohmic contact with the drain region and by forming n+- and n−regions at the side of the polycrystal silicon layer.

The effects to be obtained from the foregoing embodiments are as follows.

Since a one-way element having a reduced parasitic capacitance, such as the Schottky diode, is connected between the output MOSFET of the open drain structure and the output terminal to be connected with the bus line terminated by the impedance element, the drain parasitic capacitance can be made to dissapear from the external terminal by turning OFF the Schottky diode, even if the drain diffusion layer of the output MOSFET is left large. As a result, the disturbances of the characteristic impedance of the bus line in the vicinity of the external terminal can be prevented to drastically reduce the equivalent signal delay.

The one-way element is integrally formed in alignment with the contact hole of the output node of the output MOSFET by using the Schottky diode. Thus, a high level of integration can be maintained.

Since the aforementioned output MOSFET is composed of a plurality of MOSFETs arranged in parallel and turned ON sequentially with a time difference, still another effect is that the noises to be generated on the power source line can be suppressed.

Of the plural output MOSFETs, the MOSFET to operate finally is given a small element size, and has its drain connected directly with the external terminal by omitting the one-way element. Thus, a further effect is that it is possible not only to reduce the signal delay and the noises to be generated on the power source line but also to retain the low level margin of the output signal.

Although our invention has been specifically described in connection with its embodiments, it should not be limited thereto but can naturally be modified in various manners without departing from the scope and spirit thereof. For example, the signal level may be not only the aforementioned low swing but also one operating at the low power supply voltage and corresponding to the CMOS level of about 3 V. The external terminal is connected with the output buffer only, if it is a proprietary terminal. The input buffer can be constructed not only to use the differential circuit but also to adopt a variety of modes of embodiment.

The present invention can be applied widely to a semiconductor integrated circuit device and a data processing system using the device.

What is claimed is:

1. A semiconductor integrated circuit device formed on a semiconductor region, comprising:
   an external terminal;
   first output switching means including a first output region on the semiconductor region, for providing output data in accordance with a signal from an internal logic circuit having a predetermined logic function, to the first output region thereof;
   first Schottky diode means connected between the external terminal and the first output region of the first output switching means, for removing a parasitic capacitance of the first output region from the external terminal when the first output switching means is turned-off; and
   input means connected to the external terminal, for receiving input data transmitted through the external terminal.

2. A semiconductor integrated circuit device according to claim 1, wherein the external terminal is connected with a transmission line terminated by impedance elements.

3. A semiconductor integrated circuit device according to claim 2, wherein the transmission line has each of its two terminals supplied with a terminal voltage through the impedance elements.

4. A semiconductor integrated circuit device according to claim 3, wherein the first output switching means includes an open-drain type output MOSFET; and
   wherein the first output region is a drain region of the open-drain type output MOSFET.

5. A semiconductor integrated circuit device according to claim 4, further comprising drive means for driving the open-drain type output MOSFET in accordance with the signal from the internal logic circuit.

6. A semiconductor integrated circuit device according to claim 5, wherein the open-drain type output MOSFET has its gate fed with an output signal from the drive means.

7. A semiconductor integrated circuit device according to claim 6, wherein the first Schottky diode means is integrally formed in alignment with a contact hole provided between the drain region of the open-drain type MOSFET and the external terminal.

8. A semiconductor integrated circuit device according to claim 7, wherein the impedance elements are resistors.

9. A semiconductor integrated circuit device according to claim 6, further comprising second output switching means including a second output region on the semiconductor region, for providing the output data in accordance with the signal from the internal logic circuit having the predetermined logic function, to the second output region thereof, at a slower timing than that of the first output switching means; and
second Schottky diode means connected between the external terminal and the second output region of the second output switching means, for removing a parasitic capacitance of the second output region from the external terminal when the second output switching means is turned-off.

10. A semiconductor integrated circuit device according to claim 9, further comprising third output switching means connected between including a third output region on the semiconductor region, for providing the output data in accordance with the signal from the internal logic circuit having the predetermined logic function, to the third output region thereof, at a slower timing than that of the second output switching means.

11. A data processing system comprising:
a first semiconductor integrated circuit device formed on a first semiconductor region including:
a first external terminal; and
a first output switching element having a first output region on the first semiconductor region and providing first output data, in accordance with a first signal from a first internal logic circuit in the first semiconductor integrated circuit device, to the first output region;
a transmission line connected with the first external terminal; and
a second semiconductor integrated circuit device formed on a second semiconductor region including:
a second external terminal coupled to the transmission line;
a second output switching element having a second output region on the second semiconductor region, and providing second output data, in accordance with a second signal from a second internal logic circuit in the second semiconductor integrated circuit device, to the second output region;
a first input buffer connected with the second external terminal, which receives input data transmitted from the transmission line through the second external terminal; and
a first one-way element connected between the second external terminal and the second output region of the second output switching element, to remove a parasitic capacitance of the second output region from the second external terminal when the second output switching element is turned-off,
wherein the transmission line has its two terminals supplied with terminal voltages individually through impedance elements.

12. A data processing system according to claim 11, wherein each of the first and second output switching elements includes an open-drain type output MOSFET, and
wherein each of the first and second output regions is a drain region of the open-drain type output MOSFET.

13. A data processing system according to claim 12, wherein the first semiconductor integrated circuit device has a second one-way element connected between the first external terminal and the drain region of the open-drain type output MOSFET in the first output switching element.

14. A data processing system according to claim 13, further comprising:
a first drive circuit which drives the open-drain type output MOSFET of the first output switching element in accordance with the first signal, wherein the open-drain type output MOSFET of the first output switching element has its gate fed with a first output signal from the first drive circuit, and
a second drive circuit which drives the open-drain type output MOSFET of the second output switching element in accordance with the second signal, wherein the open-drain type output MOSFET of the second output switching element has its gate fed with a second output signal from the second drive circuit.

15. A data processing system according to claim 14, wherein each of the first and second one-way elements is a Schottky diode, and wherein the impedance elements are resistors.

16. A data processing system according to claim 15, wherein the first input buffer is a differential configuration circuit which compares the input data with a reference voltage.

17. A data processing system according to claim 13, wherein the first semiconductor integrated circuit device has a second input buffer connected with the first external terminal.

18. A data processing system according to claim 17, wherein each of the first and second one-way elements is a Schottky diode, and wherein the impedance elements are resistors.

19. A data processing system according to claim 18, wherein each of the first and second input buffers is a differential configuration circuit which compares the input data with a reference voltage.

20. A data processing system according to claim 8, wherein the input means includes a differential configuration circuit which compares the input data with a reference voltage.

21. A semiconductor integrated circuit device formed on a semiconductor region comprising:
an external terminal;
an output switching element including an output region on the semiconductor region and providing output data, in accordance with a signal from an internal logic circuit having a predetermined logic function, to the output region thereof;

an input buffer connected with the external terminal, which receives input data transmitted through the external terminal; and a one-way element connected between the external terminal and the output region of the output switching element, to remove a parasitic capacitance of the output region from the external terminal when the output switching element is turned-off.

22. A semiconductor integrated circuit device according to claim 21, wherein the external terminal is connected to a transmission line terminated by impedance elements, and wherein the transmission line has two terminals, each of which is supplied with a terminal voltage through the impedance elements.

23. A semiconductor integrated circuit device according to claim 22, wherein the output switching element includes an open-drain type MOSFET, and wherein the output region is a drain region of the open-drain type output MOSFET.

24. A semiconductor integrated circuit device according to claim 23, further comprising drive circuit which drives the open-drain type output MOSFET in accordance with the signal from the internal logic circuit.

25. A semiconductor integrated circuit device according to claim 24, wherein the open-drain type output MOSFET has its gate fed with an output signal from the drive circuit.

26. A semiconductor integrated circuit device according to claim 25, wherein the one-way element is integrally formed in alignment with a contact hole provided between the drain region of the open-drain type MOSFET and the external terminal.

27. A semiconductor integrated circuit device according claim 26, wherein the one-way element is a Schottky diode, and wherein the impedance elements are resistors.

28. A semiconductor integrated circuit device according to claim 27, wherein the input buffer is a differential configuration circuit which compares the input data with a reference voltage.

29. A data processing system comprising:
a first semiconductor integrated circuit device formed on a first semiconductor region including:
a first external terminal;
a first output switching element having a first output region on the first semiconductor region and providing first output data, in accordance with a first signal from a first internal logic circuit in the first semiconductor integrated circuit device, to the first output region; and
a first one-way element connected between the first external terminal and the first output region of the first output switching element, to remove a parasitic capacitance of the first output region from the first external terminal when the first output switching element is turned-off;
a transmission line connected to the first external terminal; and a second semiconductor integrated circuit device formed on a second semiconductor region including:
a second external terminal coupled to the transmission line; and
a first input buffer connected with the second external terminal, the first input buffer receiving input data transmitted from the transmission line through the second external terminal,
wherein the transmission line has two terminals, each of which is supplied with terminal voltages individually through impedance elements.

30. A data processing system according to claim 29, wherein the first output switching element includes an open-drain type output MOSFET, and wherein the first output region is a drain region of the open-drain type output MOSFET.

31. A data processing system according to claim 30, wherein the second semiconductor integrated circuit device includes:
a second output switching element having a second output region on the second semiconductor region and providing second output data in accordance with a second signal from a second internal logic circuit in the second semiconductor integrated circuit device, to the second output region; and
a second one-way element connected between the second external terminal and the drain region of the open-drain type output MOSFET in the second output switching element.

32. A data processing system according to claim 31, further comprising:
a first drive circuit which drives the open-drain type output MOSFET of the first output switching element in accordance with the first signal; wherein the open-drain type output MOSFET of the first output switching element has its gate fed with a first output signal from the first drive circuit; and
a second drive circuit which drives the open-drain type output MOSFET of the second output switching element in accordance with the second signal, wherein the open-drain type output MOSFET of the second output switching element has its gate fed with a second output signal from the second drive circuit.

33. A data processing system according to claim 32, wherein each of the first and second one-way elements is a Schottky diode, and wherein the impedance elements are resistors.

34. A data processing system according to claim 33, wherein the first input buffer is a differential configuration circuit which compares the input data with a reference voltage.

35. A data processing system according to claim 31, wherein the first semiconductor integrated circuit device has a second input buffer connected with the first external terminal.

36. A data processing system according to claim 35, wherein each of the first and second one-way elements is a Schottky diode, and wherein the impedance elements are resistors.

37. A data processing system according to claim 36, wherein each of the first and second input buffers is a differential configuration circuit which compares the input data with a reference voltage.

* * * * *